United States Patent
Qian et al.

(10) Patent No.: US 11,119,412 B2
(45) Date of Patent: Sep. 14, 2021

(54) EXPOSURE EQUIPMENT AND EXPOSURE METHOD

(71) Applicant: SHANGHAI MICRO ELECTRONICS EQUIPMENT (GROUP) CO., LTD., Shanghai (CN)

(72) Inventors: Jun Qian, Shanghai (CN); Sihong Zhai, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 16/637,658

(22) PCT Filed: Aug. 9, 2018

(86) PCT No.: PCT/CN2018/099543
§ 371 (c)(1),
(2) Date: Feb. 7, 2020

(87) PCT Pub. No.: WO2019/029601
PCT Pub. Date: Feb. 14, 2019

(65) Prior Publication Data
US 2021/0011388 A1    Jan. 14, 2021

(30) Foreign Application Priority Data

Aug. 10, 2017    (CN) .......................... 201710682101.5

(51) Int. Cl.
*G03F 7/20* (2006.01)
(52) U.S. Cl.
CPC ........ *G03F 7/70208* (2013.01); *G03F 7/7005* (2013.01); *G03F 7/70016* (2013.01);
(Continued)

(58) Field of Classification Search
CPC ............. G03F 7/70275; G03F 7/70208; G03F 7/70191; G03F 7/7055; G03F 7/70558; G03F 7/7085; G03F 7/7005
See application file for complete search history.

(56) References Cited

U.S. PATENT DOCUMENTS

| 4,947,030 A | 8/1990 | Takahashi | |
| 5,581,075 A * | 12/1996 | Naraki | ................. G03F 7/7005 |
| | | | 250/205 |

(Continued)

FOREIGN PATENT DOCUMENTS

| CN | 1182486 A | 5/1998 |
| CN | 1432874 A | 7/2003 |

(Continued)

*Primary Examiner* — Steven Whitesell Gordon
(74) *Attorney, Agent, or Firm* — Muncy, Geissler, Olds & Lowe, P.C.

(57) ABSTRACT

An exposure apparatus and method. The exposure apparatus includes a control system, light source system, plurality of illumination systems and plurality of projection objective lenses. The light source system is configured to emit a plurality of first illumination beams incident on the illumination systems. Each illumination system includes a variable attenuator and branch energy detector. The branch energy detector is configured to detect an illuminance level of a second illumination beam generated in the corresponding illumination system and feed it back to the control system. The control system is configured to adjust the illuminance levels of the second illumination beams in the respective illumination systems by controlling the respective variable attenuators therein. The exposure apparatus and method have improved exposure performance and allow finer and faster energy adjustments, thus enabling precise control and higher exposure accuracy.

12 Claims, 2 Drawing Sheets

(52) U.S. Cl.
CPC ........ *G03F 7/7055* (2013.01); *G03F 7/70075* (2013.01); *G03F 7/7085* (2013.01); *G03F 7/70275* (2013.01)

(56) References Cited

U.S. PATENT DOCUMENTS

| | | | |
|---|---|---|---|
| 5,617,181 | A | 4/1997 | Yanagihara et al. |
| 6,028,660 | A | 2/2000 | Van Der Laan et al. |
| 6,256,087 | B1 * | 7/2001 | Bader ................. G03F 7/70058 355/53 |
| 2004/0021845 | A1 * | 2/2004 | Kawahara ........... G03F 7/70108 355/67 |
| 2004/0119963 | A1 | 6/2004 | Asaishi |

FOREIGN PATENT DOCUMENTS

| | | |
|---|---|---|
| CN | 101510054 A | 8/2009 |
| CN | 102253602 A | 11/2011 |
| CN | 202472238 U | 10/2012 |
| CN | 103293864 A | 9/2013 |
| CN | 106933040 A | 7/2017 |
| CN | 107966882 A | 4/2018 |
| CN | 108121163 A | 6/2018 |
| JP | S-61116319 U | 7/1986 |
| JP | H-08139009 A | 5/1996 |
| JP | H-11504443 A | 4/1999 |
| JP | 2001237169 A | 8/2001 |
| JP | 2003203853 A | 7/2003 |
| JP | 2003295459 A | 10/2003 |
| JP | 2005026511 A | 1/2005 |
| JP | 2006343684 A | 12/2006 |

\* cited by examiner

EXPOSURE EQUIPMENT AND EXPOSURE METHOD

TECHNICAL FIELD

The present invention relates to the technical field of semiconductor and, more specifically, to an exposure apparatus and exposure method.

BACKGROUND

Photolithography employed in semiconductor technology is the best and most common one of the existing processing technique for fabricating ultra-fine structures. In particular, as part of photolithography, exposure is a crucial process for the fabrication of modern large-scale integration (LSI), micro-electro-mechanical structures (MEMS) and panel display devices (e.g., LCD, OLED, etc.).

Photolithography is similar in mechanism to camera photography. A light source generator may be used to form a desired highly uniform illumination field-of-view (FOV) on a photomask with a desired pattern and held on a mask stage, and an aberration-free image of the illuminated mask pattern may be then projected by a projection objective lens onto a substrate held on a workpiece stage, followed by subsequent processes for forming the desired ultra-fine structures. In addition to the desired highly uniform illumination FOV, the used exposure apparatus is also required to have the ability of precise exposure dosage control. However, with the increasing sizes of final products, a larger scanning width is always demanded, posing more and more stringent requirements on such exposure apparatuses.

Therefore, how to improve exposure accuracy becomes a problem to be solved by skilled persons in the art.

SUMMARY OF THE DISCLOSURE

It is just an objective of the present invention to provide an exposure apparatus and method with improved exposure accuracy.

To this end, the present invention provides an exposure apparatus, comprising a control system, a light source system, a plurality of illumination systems and a plurality of projection objective lenses, the light source system configured to emit a plurality of first illumination beams incident on the plurality of illumination systems, each of the illumination systems comprising a variable attenuator and a branch energy detector, the branch energy detector configured to detect an illuminance level of a second illumination beam generated in a corresponding one of the illumination systems and feed back the detected illuminance level to the control system, the control system configured to adjust the illuminance level of the second illumination beam in the corresponding illumination system by controlling the variable attenuators therein.

Optionally, in the exposure apparatus, the light source system comprises a light source generator and a light beam unit, the light beam unit configured to split a light beam emitted from the light source generator into the plurality of first illumination beams each incident on a respective one of the illumination systems.

Optionally, in the exposure apparatus, the light source system comprises a plurality of light source generators each configured to emit one of the first illumination beams incident on a respective one of the illumination systems.

Optionally, in the exposure apparatus, the variable attenuator comprises two position-adjustable light shading plates each having a plurality of through-holes, and wherein a transmittance of a corresponding one of the first illumination beams is controlled by adjusting a relative position between the two light shading plates.

Optionally, in the exposure apparatus, each of the light source generator(s) comprises a mercury lamp.

Optionally, in the exposure apparatus, the light source system further comprises a plurality of constant light intensity detectors, each configured to detect a light intensity of the first illumination beam generated by a respective one of the light source generators.

Optionally, in the exposure apparatus, each of the illumination systems further comprises a light homogenizing unit, the branch energy detector configured to detect an illuminance level of a second illumination beam generated in the light homogenizing unit.

Optionally, in the exposure apparatus, each of the light homogenizing units comprises a first homogenizing rod and a second homogenizing rod connected to the first homogenizing rod, and wherein the branch energy detector is configured to detect an illuminance level of a second illumination beam coming out from a joint between the first homogenizing rod and the second homogenizing rod.

Optionally, in the exposure apparatus, each of the light homogenizing units further comprises a branch reflecting mirror and a diaphragm, and wherein the second illumination beam coming out from the joint between the first homogenizing rod and the second homogenizing rod is reflected by the branch reflecting mirror and passes through the diaphragm before being detected by the branch energy detector.

Optionally, in the exposure apparatus, the exposure apparatus further comprises a calibration energy detector configured to detect illuminance levels of exposure light beams in image planes of the respective projection objective lenses, wherein the control system is configured to make illuminance levels of the second illumination beams to match one another based on the detected illuminance levels of the exposure light beams.

The present invention also provides an exposure method, using the exposure apparatus of claim 10 to perform an exposure process on a workpiece placed at the image planes of the projection objective lenses of the exposure apparatus, the method comprising the steps of:

prior to performing the exposure process on the workpiece, detecting illuminance levels of exposure light beams in the image planes of the respective projection objective lenses and making illuminance levels of the second illumination beams to match one another; and loading the workpiece to perform the exposure process, detecting and feeding back, by the branch energy detectors in real time, the illuminance levels of the second illumination beams in the respective illumination systems, and determining in real time energy variations in the second illumination beams; if the energy variations lie within a range defined by energy variation thresholds, calculating in real time amounts of energy required to be adjusted and controlling the respective variable attenuators to make adjustments; if the energy variations exceed the range defined by the energy variation thresholds, ceasing the exposure process and raising an alarm.

Optionally, in the exposure method, further comprising, if the energy variations exceed the range defined by the energy variation thresholds:

step 1, zeroing the variable attenuators in the illumination systems to have a zero attenuation;

step 2, performing a test exposure in which the calibration energy detectors detect the illuminance levels of the exposure light beams in the image planes of the respective projection objective lenses and calibrate the branch energy detectors in the illumination systems;

step 3, performing a further test exposure in which the calibration energy detectors detect the illuminance levels of the exposure light beams in the image planes of the respective projection objective lenses, taking one of the variable attenuators corresponding to a minimum value of the detected illuminance levels as a reference, calculating an attenuation level for remaining ones of the variable attenuators and configuring the variable attenuators based on the attenuation levels;

step 4, performing a still further test exposure, determining whether the illuminance levels of the exposure light beams in the image planes of the respective projection objective lenses meet a requirement for illuminance matching, followed by storing quantities for calibrating the branch energy detectors and taking the attenuation levels for the variable attenuators as mechanical constants to complete illuminance matching if the determination is positive or looping back to step 2 if the determination is negative.

Optionally, in the exposure method, the light source system comprises a plurality of light source generators each configured to generate one of the first illumination beams incident on a respective one of the illumination systems, wherein the light source system further comprises constant light intensity detectors each configured to detect a light intensity of the first illumination beam provided by a respective one of the light source generators, and wherein the exposure method further comprises, between steps 1 and 2:

performing a test exposure in which the calibration energy detectors detect the illuminance levels of the exposure light beams in the image planes of the respective projection objective lenses and taking one of the constant light intensity detectors corresponding to a minimum value of the detected illuminance levels as a reference, calibrating remaining ones of the constant light intensity detectors; and measuring the light intensities of the first illumination beams generated by the light source generators by using the respective calibrated constant light intensity detectors, taking the one of the light source generators corresponding to a minimum value of the detected light intensities as a reference, calculating electrical power levels for remaining ones of the light source generators and configuring the light source generators based on the calculated electrical power levels.

In summary, according to the exposure apparatus and method provided in the present invention, the exposure apparatus has a plurality of illumination systems each of which has a variable attenuator and a branch energy detector, wherein the branch energy detector detects an illuminance level of an illumination beam in a respective branch and feeds it back to the control system, and the control system then controls the variable attenuator in the respective illumination system to adjust the illuminance level of the illumination beam in the respective branch. As a result, the energy control strategy for the exposure apparatus is optimized, which results in improved exposure performance, allows finer and faster energy adjustments and reduces the overall energy loss while posing minor impacts on other performance aspects of a photolithography machine. As a result, precise control and enhanced exposure accuracy can be achieved.

DETAILED DESCRIPTION

Reference is now made to the accompanying drawings for a better understanding of objectives, features and advantages of the present invention. It should be noted that architectural, proportional, dimensional and other details in the figures are presented only for the purpose of facilitating, in conjunction with the disclosure herein, the understanding and reading of those familiar with the art rather than being intended to limit conditions under which the present invention can be implemented. Therefore, they are technically of no substantive significance, and any and all architectural modifications, proportional variations or dimensional changes that do not affect the benefits and objectives of the present invention are considered to fall within the scope of the teachings herein.

The present invention provides an exposure apparatus, including a control system, a light source system, a plurality of illumination systems and a plurality of projection objective lenses. The light source system is configured to emit a plurality of first illumination beams incident on the plurality of illumination systems. Each of the illumination systems includes a variable attenuator and a branch energy detector. The branch energy detector of each illumination system is configured to detect and an illuminance level of a second illumination beam generated in the respective illumination system and feed it back to the control system. The control system is configured to adjust the illuminance levels of the second illumination beams by controlling the variable attenuators of the respective illumination systems.

Only one light source system may be included, which includes a light source generator and a light beam unit. The light beam unit is configured to split a light beam emitted from the light source generator into the plurality of first illumination beams. Each of the first illumination beams is incident on a respective one of the illumination systems. In this way, the one light source system may correspond to the plurality of illumination systems to achieve a one-to-many correspondence relationship between the light source system and the illumination systems.

Alternatively, a plurality of light source systems may be included, each corresponding to a respective one of the illumination systems to achieve a one-to-one correspondence relationship between the plurality of light source systems and the plurality of illumination systems, thereby satisfying the requirements in different kinds of productions.

Figure 1:
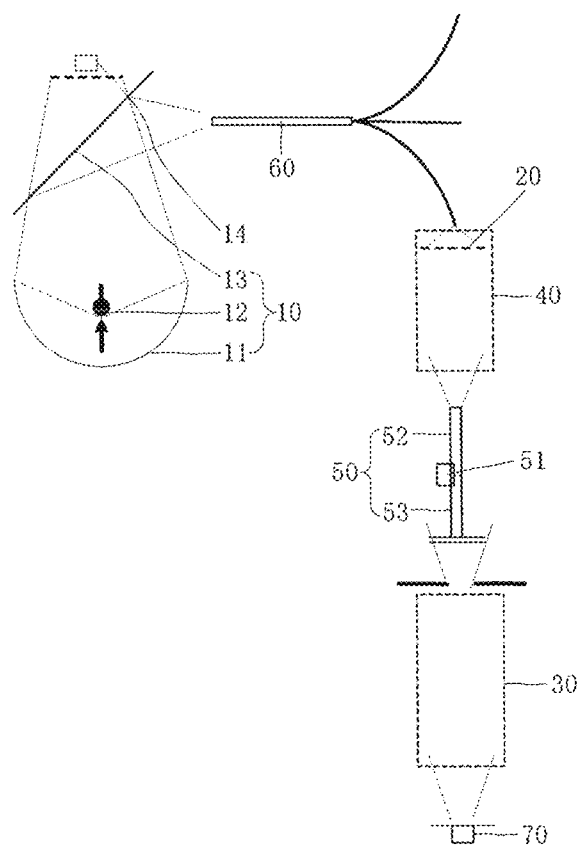
FIG. 1 is a structural schematic of a single illumination system and a single light source system in an exposure apparatus according to an embodiment of the present invention.

As shown in FIG. 1, for example, in the exposure apparatus, one light source system corresponds to a plurality of illumination systems. The exposure apparatus may include one light source system, a plurality of illumination systems, a plurality of projection objective lenses 30 and a control system. For the sake of simplicity, only one of the illumination systems and one of the projection objective lenses 30 are shown in FIG. 1. The light source system includes a light source generator 10, and the illumination system includes a variable attenuator 20. The light source generator 10 is configured to emit an illumination beam, and the variable attenuator 20 is configured to remove a part of the illumination beam for energy control, wherein the illumination beam which has been subject to such energy control is emitted out from the projection objective lens 30. In the case of the one-to-many correspondence relationship, the light source system further includes a light beam unit 60 configured to split the illumination beam generated by the light source generator 10 into a plurality of first illumination beams. Each of these first illumination beams may have the same combination of parameters so that the plurality of first illumination beams resulting from the same light source generator 10 form different branches.

Figure 2:
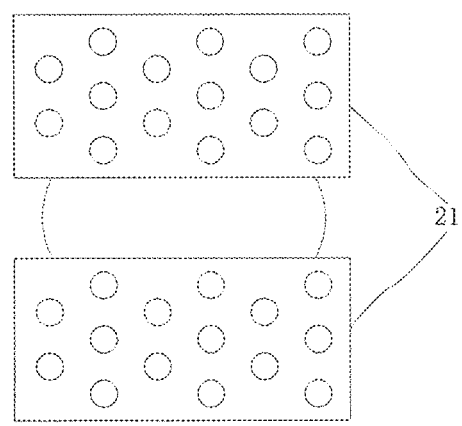
FIG. 2 is a schematic cross-sectional view of a variable attenuator in an exposure apparatus according to an embodiment of the present invention.

As shown in FIG. 2, the variable attenuator 20 includes two light shading plates. Each of the two light shading plates 21 has a plurality of through-holes. By virtue of the through-holes, the light shading plates 21 can control the feed amount of the respective first illumination beam for energy control, so that the energy of the first illumination beam in each light branch can be adjusted separately by the light shading plates 21. In this embodiment, the first illumination beam may pass through an unshaded middle area between the two light shading plates 21 as well as though the through-holes. The feed amount of the first illumination beam can be controlled through adjusting the size of the middle area by moving the two light shading plates 21 relative to each other. The through-holes are helpful in maintaining good uniformity of the illumination beam and thus prevent the illumination beam from being of bad uniformity resulting from shading and diffraction. While the figure shows feed amount control accomplished with two rectangular light shading plates arranged one above another in the shown view, it would be appreciated that such feed amount control may also be achieved by light shading plates of different shapes or combinations thereof, for example, of a circular shape, or otherwise arranged in the shown view, such as left to right.

In this embodiment, the light source generator 10 may include a bowl-shaped body 11 having a reflective surface, as well as a mercury lamp 12 and a reflecting mirror 13 both disposed inside the bowl-shaped body 11. The illumination beam generated by the mercury lamp 12 is reflected by the bowl-shaped body 11 and reflecting mirror 13, thereby converging at a location of a focal plane, i.e., the location of incident for the light beam unit 60. The mercury lamp can be used as a preferred light source because it has high luminous efficiency, a long service life and a desirable light color.

Optionally, each light source system may further include a constant light intensity detector 14 configured to detect a light intensity of the illumination beam generated by the respective light source generator 10. In order to prevent the illumination beam from being influenced with an increased service time of the light source generator 10, it is desired to use the constant light intensity detector 14 to detect the light intensity of the illumination beam to determine whether the illumination beam satisfies the requirements. By monitoring the light intensity of the mercury lamp 12 in real time, electrical power thereof can be adjusted in real time to always maintain a satisfactory illuminance level of the illumination beam.

In this embodiment, the exposure apparatus may further include coupling units 40 each configured to apply a coupling action to the respective illumination beam that has undergone the energy control. Numerical aperture (NA) parameters and fusion performance of the illumination beam can be adjusted under the coupling action applied by the coupling units 40, and thus a desired illumination beam can be formed and an improved utilization is achieved. In addition, the coupling action can change the cross-sectional shape of the light beam from a circular to a rectangular or regular polygonal shape desired by the respective branch.

In this embodiment, each of the illumination systems may further include a light homogenizing unit 50. A branch energy detector 51 in the light homogenizing unit 50 is configured to detect the second illumination beam generated by the light homogenizing unit 50 in the respective branch. The light homogenizing unit 50 may be able to homogenize the illumination beam that has been subject to the coupling action so that the illumination beam has the desired homogeneity. An insufficient homogeneity level may lead to inferior exposure accuracy. After sufficient homogenization in the light homogenizing unit 50, the illumination beam will emit a uniform light spot at an emission end face.

Figure 3:
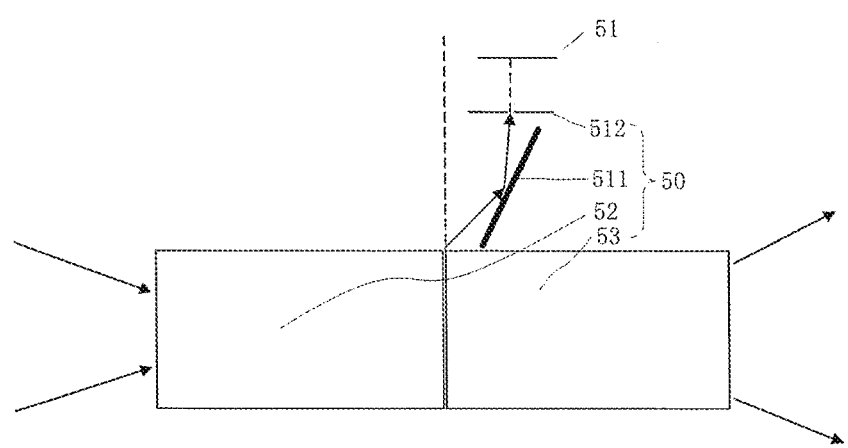
FIG. 3 is a structural schematic of a light homogenizing unit in an exposure apparatus according to an embodiment of the present invention.

In addition, as shown in FIG. 3, the light homogenizing unit 50 may include a first homogenizing rod 52 and a second homogenizing rod 53 connected to the first homogenizing rod 52, wherein the branch energy detector 51 detects the second illumination beam emitted from the joint between the first homogenizing rod 52 and the second homogenizing rod 53, and a part of the illumination beam will be emitted from the joint and detected by the branch energy detector 51, only a little part of the illumination beam may be diverted (the percentage may be lower than 0.1% so that its influence on the energy balance of the first illumination beam may be ignorable), the diverted part of the illumination beam forms the second illumination beam which enters into the branch energy detector 51 and is used to reflect the parameters of the overall illumination beam in the light homogenizing unit 50. In this way, energy changes in the illumination beams in the exposure apparatus can be fed back in real time. The first homogenizing rod 52 and/or the second homogenizing rod 53 may be made of quartz and able to make an illumination beam passing therethrough to become more homogeneous. Quartz, such as fused quartz, is a preferred material for the homogenizing rods.

In this embodiment, the light homogenizing unit 50 may include a branch reflecting mirror 511 and a diaphragm 512, wherein the second illumination beam coming out from the joint between the first and second homogenizing rods 52, 53 is reflected by the branch reflecting mirror 511, passes through the diaphragm 512 and reaches the branch energy detector 51.

Optionally, a plurality of projection objective lenses 30 may be included each corresponding to a respective one of the illumination systems. The exposure apparatus may further comprise calibration energy detectors 70 configured to detect illuminance levels of the exposure light beams on image planes of the projection objective lenses. Based on the detected illuminance levels of the exposure light beams on the image planes, the control system may match the illuminance levels of the illumination beams incident on the projection objective lenses 30 to one another. The exposure light beams are emitted from the projection objective lenses 30 to the calibration energy detectors 70, and the calibration energy detectors 70 can be situated in a plane of a substrate. The calibration energy detectors 70 may be deployed in the optical path only when a calibration for working condition is required, and may be removed away for a normal production process. Through detecting the illuminance levels of the exposure light beams by using the calibration energy detectors 70, it is possible to carry out correction or calibration on the constant light intensity controllers 14 for the mercury lamps 12 or on the branch energy detectors 51.

In the case that a plurality of sub-systems are included, it is likely that the energy of the exposure light beams from the exposure sub-systems does not match one another, and the difference in energy may degrade the overall performance of the photolithography machine. According to the present invention, an illuminance matching can be performed on the sub-systems to achieve that the exposure light beams generated by different sub-systems may have equal illuminance levels, so that differences in the energy of the exposure light beams from the exposure sub-systems can be avoided, thereby achieving extremely precise energy adjustments, fast matching convergence and reduced overall energy loss while posing minor impacts on other performance aspects of the photolithography machine. As a result, the exposure accuracy of the exposure system in the photolithography machine, for example, for fabricating TFTs, can be improved.

According to this embodiment, since a single light source system corresponds to a plurality of illumination systems, the first illumination beams entering into the respective illumination systems are originated from the same light source generator 10 and thus have substantially identical illumination parameters, which makes the first illumination beams received by the respective illumination systems to have a good intrinsic consistency. Therefore, the constant light intensity controllers 14 can be omitted.

In another embodiment of the present invention, a plurality of light source systems is employed, and each of a plurality of light source systems corresponds to a respective one of a plurality of illumination systems. In this case, the light beam unit 60 in FIG. 1 can be omitted, and the first illumination beams generated by the respective light source generators 10 can be directly guided to the respective variable attenuators 20 in the respective illumination systems. However, in order to ensure good consistency among the first illumination beams from the respective light source generators 10, the light source generators 10 are preferably provided with respective constant light intensity controller 14 so that the light source generators 10 can be adjusted based on detected values of the respective fixed light intensity controllers 14. The remaining structure of this embodiment may be the same as that of the embodiment shown in FIG. 1. The present invention also provides an exposure method using the exposure apparatus as defined above to perform an exposure process on a workpiece placed at image planes of the projection objective lenses 30. The method includes the steps as detailed below.

Prior to performing the exposure process on the workpiece, illuminance levels of exposure light beams incident on the image planes of the respective projection objective lenses 30 are detected. Based on the results of the detection, illuminance levels of the illumination beams incident on the projection objective lenses 30 are matched to one another. Locations of the image planes of the projection objective lenses correspond to that of a surface of the workpiece that is subsequently loaded.

During the exposure process subsequent to the loading of the workpiece, the branch energy detectors 51 detect and feed back in real time illuminance levels of the second illumination beams in the respective illumination systems, and the control system determines in real time energy variations in the second illumination beams, if the energy variations lie within a range defined by energy variation thresholds, it calculates in real time energy required to be adjusted and controls the respective variable attenuators 20 to make adjustments; if the energy variations exceed the range defined by the energy variation thresholds, the exposure process is ceased, followed by raising an alarm or triggering an illuminance matching on the illumination beams incident on the respective projection objective lenses 30 to one another.

In this exposure method, the illuminance matching on the illumination beams incident on the projection objective lenses 30 to one another includes the steps of:

step 1: zeroing the variable attenuators 20 in the illumination systems to have a zero attenuation;

step 2: performing a test exposure in which the calibration energy detectors 70 detect the illuminance levels of the exposure light beams on the image planes of the respective projection objective lenses 30 and calibrate the branch energy detectors 51 in the illumination systems;

step 3: performing another test exposure in which the calibration energy detectors 70 detect the illuminance levels of the exposure light beams on the image planes of the respective projection objective lenses 30, taking the one of the variable attenuators 20 corresponding to the minimum value of the detected illuminance levels as a reference, calculate an attenuation level for all the remaining variable attenuators 20 and configuring the variable attenuators 20 based on the calculated attenuation level;

step 4: performing still another test exposure in which it is determined whether the illuminance levels of the exposure light beams on the image planes of the respective projection objective lenses 30 are matched to one another. If so, the quantities for calibrating the branch energy detectors 51 and the attenuation level for the variable attenuators 20 are stored as a mechanical constant, thus ending the whole process. Otherwise, the process loops back to step 2.

Optionally, when the exposure apparatus includes a plurality of light source systems, constant light intensity detectors 14 may be further included, each corresponding to a respective one of the light source systems and configured to detect the light intensity of an illumination beam generated by the light source generator 10 in the respective light source system. In this case, the method may further include, between steps 1 and 2:

performing a test exposure in which the calibration energy detectors 70 detect the illuminance levels of the exposure light beams on the image planes of the respective projection objective lenses 30 and with the one of the constant light intensity detectors 14 corresponding to the minimum value of the detected illuminance levels as a reference, calibrate all the remaining constant light intensity detectors 14; and measuring the light intensities of the first illumination beams generated by the light source generators 10 with the respective calibrated constant light intensity detectors 14, with the one of the light source generators 10 corresponding to the minimum value of the detected light intensities as a reference, calculating an electrical power level for all the remaining light source generators 10 and configuring the light source generators 10 based on the calculated electrical powerlevels.

The exposure calibration performed on the exposure apparatus prior to the exposure process may include the following steps.

1. A calibration mode is activated, in which the exposure apparatus initiates an illuminance matching program.

2. The variable attenuators in the respective branches are zeroed and their attenuation levels may be zeroed by configuring dimmers.

3. A first test exposure is performed to obtain illuminance levels of the exposure light beams on the image planes of the projection objective lenses for the respective branches. In particular, the illuminance levels of the exposure light beams for the respective branches can be obtained by the calibration energy detectors.

4. The light source generators are calibrated with the minimum value of the illuminance levels for the respective branches, and the minimum value is fed back as a calibration reference, based on which an electrical power level for the light source generators is calculated and the light source generators are configured. In particular, mercury lamps 12 may be used as the light source generators, and the constant light intensity detectors 14 may detect light intensities of the first illumination beams generated by the respective light source generators 10. The minimum value of the all the constant light intensity detectors is taken as a reference, electrical power levels of the remaining light source generators may be adjusted so that the light intensities detected by the constant light intensity detectors are equal to one another.

5. A second exposure test is performed, in which the calibration energy detectors again obtains illuminance levels of the exposure light beams on the image planes of the projection objective lenses for the respective branches.

6. A calibrating calculation is performed and the illumination beams are calibrated. The minimum value of the illuminance levels for the branches is taken as a reference, an attenuation level for the variable attenuators 20 in the respective branches is calculated and applied. In particular, the calibration energy detectors may perform a calibration on the second illumination beams detected by the branch energy detectors 51.

7. A third test exposure is performed, in which the calibration energy detectors obtains illuminance levels of the exposure light beams on the image planes of the projection objective lenses for the respective branches.

8. It is determined whether the illuminance levels meet a predefined criterion. If so, the process proceeds to step 9. Otherwise, the process loops back to the step for performing a calibrating calculation.

9. The attenuation level for the variable attenuators and the calibration result of the calibration energy detectors are stored as mechanical constants, thereby completing the illuminance matching process. The obtained mechanical constants, including the attenuation level for the variable attenuators and the calibration result of the calibration energy detectors are subsequently used as parameters for configuration in the production process.

In order for guaranteed exposure accuracy to be obtained, the exposure apparatus of the invention may be designed with an exposure monitoring method including the following steps.

1. The branch energy detectors feed back in real time illuminance levels of the illumination beams in the respective branches.

2. Based on the illuminance levels fed back from the branch energy detectors, it is determined in real time whether energy variations in the illumination beams in the respective branches meet a predefined criterion for determining matched illuminance levels. If the determination is positive, the process loops back to the previous step. Otherwise, the process proceeds to the next step.

3. It is determined whether the energy variations in the illumination beams go beyond a predefined range. If so, the exposure process is ceased, concurrent with an alarm being raised and the exposure calibration method being triggered. Otherwise, the process proceeds to the next step.

4. An amount of energy required to be adjusted in real time is calculated.

5. An adjustment approach is selected according to the predefined range, such as manual intervention or automatic energy control by the variable attenuators.

6. The process loops back to the beginning for real-time monitoring.

In order to facilitate understanding of the above embodiments, the above description is given based on paths of the light beams. While a description and illustration of other components such as optical lenses is omitted in the above description and accompanying drawings, characteristic values and input-output relationships of these components can be obtained by calibration, and their relative positions can be adjusted according to the optical paths.

In summary, according to the exposure apparatus and method provided in the present invention, the exposure apparatus has a plurality of illumination systems each of which has a variable attenuator and a branch energy detector, wherein the branch energy detector detects an illuminance level of an illumination beam in a respective branch and feeds it back to the control system, and the control system then controls the variable attenuator in the respective illumination system to adjust the illuminance level of the illumination beam in the respective branch. As a result, the energy control strategy for the exposure apparatus is optimized, which results in improved exposure performance, allows finer and faster energy adjustments and reduces the overall energy loss while posing minor impacts on other performance aspects of a photolithography machine. As a result, precise control and enhanced exposure accuracy can be achieved.

The description presented above is merely that of some preferred embodiments of the present invention and does not limit the scope thereof in any sense. Any and all changes and modifications made by those of ordinary skill in the art based on the above teachings fall within the scope as defined in the appended claims.

What is claimed is:

1. An exposure apparatus, comprising a control system, a light source system, a plurality of illumination systems and a plurality of projection objective lenses, the light source system configured to emit a plurality of first illumination beams incident on the plurality of illumination systems, each of the illumination systems comprising a variable attenuator and a branch energy detector, the branch energy detector configured to detect an illuminance level of a second illumination beam generated in a corresponding one of the illumination systems and feed back the detected illuminance level to the control system, the control system configured to adjust the illuminance level of the second illumination beam in the corresponding illumination system by controlling the variable attenuators therein; wherein the exposure apparatus further comprises a calibration energy detector configured to detect illuminance levels of exposure light beams in image planes of the respective projection objective lenses, wherein the control system is configured to make illuminance levels of the second illumination beams to match one another based on the detected illuminance levels of the exposure light beams, wherein steps for matching the illuminance levels of the second illumination beams with one another comprise:
step 1, zeroing the variable attenuators in the illumination systems to have a zero attenuation;
step 2, performing a test exposure in which the calibration energy detectors detect the illuminance levels of the exposure light beams in the image planes of the respective projection objective lenses and calibrate the branch energy detectors in the illumination systems;

step 3, performing a further test exposure in which the calibration energy detectors detect the illuminance levels of the exposure light beams in the image planes of the respective projection objective lenses, taking one of the variable attenuators corresponding to a minimum value of the detected illuminance levels as a reference, calculating an attenuation level for remaining ones of the variable attenuators and configuring the variable attenuators based on the attenuation levels; and step 4, performing a still further test exposure, determining whether the illuminance levels of the exposure light beams in the image planes of the respective projection objective lenses meet a requirement for illuminance matching, followed by storing quantities for calibrating the branch energy detectors and taking the attenuation levels for the variable attenuators as mechanical constants to complete illuminance matching if the determination is positive or looping back to step 3 if the determination is negative.

2. The exposure apparatus of claim 1, wherein the light source system comprises a light source generator and a light beam unit, the light beam unit configured to split a light beam emitted from the light source generator into the plurality of first illumination beams each incident on a respective one of the illumination systems.

3. The exposure apparatus of claim 2, wherein the light source generator comprises a mercury lamp.

4. The exposure apparatus of claim 1, wherein the light source system comprises a plurality of light source generators each configured to emit one of the first illumination beams incident on a respective one of the illumination systems.

5. The exposure apparatus of claim 4, wherein the light source system further comprises a plurality of constant light intensity detectors, each configured to detect a light intensity of the first illumination beam generated by a respective one of the light source generators.

6. The exposure apparatus of claim 4, wherein each of the light source generators comprises a mercury lamp.

7. The exposure apparatus of claim 1, wherein the variable attenuator comprises two position-adjustable light shading plates each having a plurality of through-holes, and wherein a transmittance of a corresponding one of the first illumination beams is controlled by adjusting a relative position between the two light shading plates.

8. The exposure apparatus of claim 1, wherein each of the illumination systems further comprises a light homogenizing unit, the branch energy detector configured to detect an illuminance level of a second illumination beam generated in the light homogenizing unit.

9. The exposure apparatus of claim 8, wherein each of the light homogenizing units comprises a first homogenizing rod and a second homogenizing rod connected to the first homogenizing rod, and wherein the branch energy detector is configured to detect an illuminance level of a second illumination beam coming out from a joint between the first homogenizing rod and the second homogenizing rod.

10. The exposure apparatus of claim 9, wherein each of the light homogenizing units further comprises a branch reflecting mirror and a diaphragm, and wherein the second illumination beam coming out from the joint between the first homogenizing rod and the second homogenizing rod is reflected by the branch reflecting mirror and passes through the diaphragm before being detected by the branch energy detector.

11. An exposure method, using the exposure apparatus of claim 1 to perform an exposure process on a workpiece placed at the image planes of the projection objective lenses of the exposure apparatus, the method comprising the steps of:

prior to performing the exposure process on the workpiece, detecting illuminance levels of exposure light beams in the image planes of the respective projection objective lenses and making illuminance levels of the second illumination beams to match one another; and loading the workpiece to perform the exposure process, detecting and feeding back, by the branch energy detectors in real time, the illuminance levels of the second illumination beams in the respective illumination systems, and determining in real time energy variations in the second illumination beams;

if the energy variations lie within a range defined by energy variation thresholds, calculating in real time amounts of energy required to be adjusted and controlling the respective variable attenuators to make adjustments; if the energy variations exceed the range defined by the energy variation thresholds, ceasing the exposure process and raising an alarm and performing following steps:

step 1, zeroing the variable attenuators in the illumination systems to have a zero attenuation;

step 2, performing a test exposure in which the calibration energy detectors detect the illuminance levels of the exposure light beams in the image planes of the respective projection objective lenses and calibrate the branch energy detectors in the illumination systems;

step 3, performing a further test exposure in which the calibration energy detectors detect the illuminance levels of the exposure light beams in the image planes of the respective projection objective lenses, taking one of the variable attenuators corresponding to a minimum value of the detected illuminance levels as a reference, calculating an attenuation level for remaining ones of the variable attenuators and configuring the variable attenuators based on the attenuation levels; and step 4, performing a still further test exposure, determining whether the illuminance levels of the exposure light beams in the image planes of the respective projection objective lenses meet a requirement for illuminance matching, followed by storing quantities for calibrating the branch energy detectors and taking the attenuation levels for the variable attenuators as mechanical constants to complete illuminance matching if the determination is positive or looping back to step 3 if the determination is negative.

12. The exposure method of claim 11, wherein the light source system comprises a plurality of light source generators each configured to generate one of the first illumination beams incident on a respective one of the illumination systems, wherein the light source system further comprises constant light intensity detectors each configured to detect a light intensity of the first illumination beam provided by a respective one of the light source generators, and wherein the exposure method further comprises, between steps 1 and 2:

performing a test exposure in which the calibration energy detectors detect the illuminance levels of the exposure light beams in the image planes of the respective projection objective lenses and taking one of the constant light intensity detectors corresponding to a minimum value of the detected illuminance levels as a reference, calibrating remaining ones of the constant light intensity detectors; and measuring the light intensities of the first illumination beams generated by the light source generators by using the respective calibrated constant light intensity detectors, taking the one of the light source generators corresponding to a minimum value of the detected light intensities as a reference, calculating electrical power levels for remaining ones of the light source generators and configuring the light source generators based on the calculated electrical power levels.

* * * * *